(12) United States Patent
Ziari et al.

(10) Patent No.: US 9,172,467 B2
(45) Date of Patent: Oct. 27, 2015

(54) RAMAN PUMP CIRCUIT

(75) Inventors: Mehrdad Ziari, Pleasanton, CA (US); Scott Corzine, Sunnyvale, CA (US); Masaki Kato, Palo Alto, CA (US); Michael Francis Van Leeuwen, Bethesda, MD (US); Radhakrishnan L. Nagarajan, Cupertino, CA (US); Matthew L. Mitchell, Monte Sereno, CA (US); Fred A. Kish, Jr., Palo Alto, CA (US)

(73) Assignee: Infinera Corporation, Sunnyvale, CA (US)

(*) Notice: Subject to any disclaimer, the term of this patent is extended or adjusted under 35 U.S.C. 154(b) by 148 days.

(21) Appl. No.: 13/449,532

(22) Filed: Apr. 18, 2012

(65) Prior Publication Data
US 2013/0279911 A1    Oct. 24, 2013

(51) Int. Cl.
*H04B 10/291* (2013.01)
*H01S 3/094* (2006.01)
*H01S 5/40* (2006.01)
*H01S 3/30* (2006.01)
*H01S 5/00* (2006.01)

(52) U.S. Cl.
CPC ...... *H04B 10/2916* (2013.01); *H01S 3/094073* (2013.01); *H01S 3/302* (2013.01); *H01S 5/005* (2013.01); *H01S 5/4012* (2013.01)

(58) Field of Classification Search
CPC ... H01S 3/094073; H01S 3/302; H01S 5/005; H01S 5/4012
USPC .................... 359/334, 341.1, 341.3
See application file for complete search history.

(56) References Cited

U.S. PATENT DOCUMENTS

| | | | | |
|---|---|---|---|---|
| 5,790,303 | A  * | 8/1998 | Weston et al. | 359/345 |
| 6,522,796 | B1 * | 2/2003 | Ziari et al. | 385/11 |
| 6,603,593 | B2 * | 8/2003 | Fidric et al. | 359/334 |
| 6,728,029 | B2 * | 4/2004 | Krummrich | 359/344 |
| 6,760,151 | B1 * | 7/2004 | Vail et al. | 359/341.3 |
| 7,088,878 | B2 * | 8/2006 | Waagaard et al. | 385/11 |
| 7,366,364 | B2 * | 4/2008 | Singh et al. | 385/11 |
| 7,379,233 | B2 * | 5/2008 | Nakamoto et al. | 359/334 |
| 8,260,136 | B2 * | 9/2012 | Nagarajan et al. | 398/74 |
| 2003/0053199 | A1 * | 3/2003 | Akasaka et al. | 359/341.3 |
| 2003/0174387 | A1 * | 9/2003 | Eggleton et al. | 359/334 |
| 2004/0096141 | A1 * | 5/2004 | Singh et al. | 385/11 |
| 2009/0245796 | A1 * | 10/2009 | Little et al. | 398/79 |
| 2009/0279576 | A1 * | 11/2009 | Joyner et al. | 372/26 |

* cited by examiner

*Primary Examiner* — Eric Bolda
(74) *Attorney, Agent, or Firm* — David L. Soltz

(57) ABSTRACT

A Raman pump may include a dual output laser configured to output two optical signals; a delay interferometer configured to delay a first of the two optical signals to decorrelate the two optical signals from each other; and a combiner configured to combine the delayed first of the two optical signals and a second of the two optical signals to provide a Raman amplification signal.

19 Claims, 6 Drawing Sheets

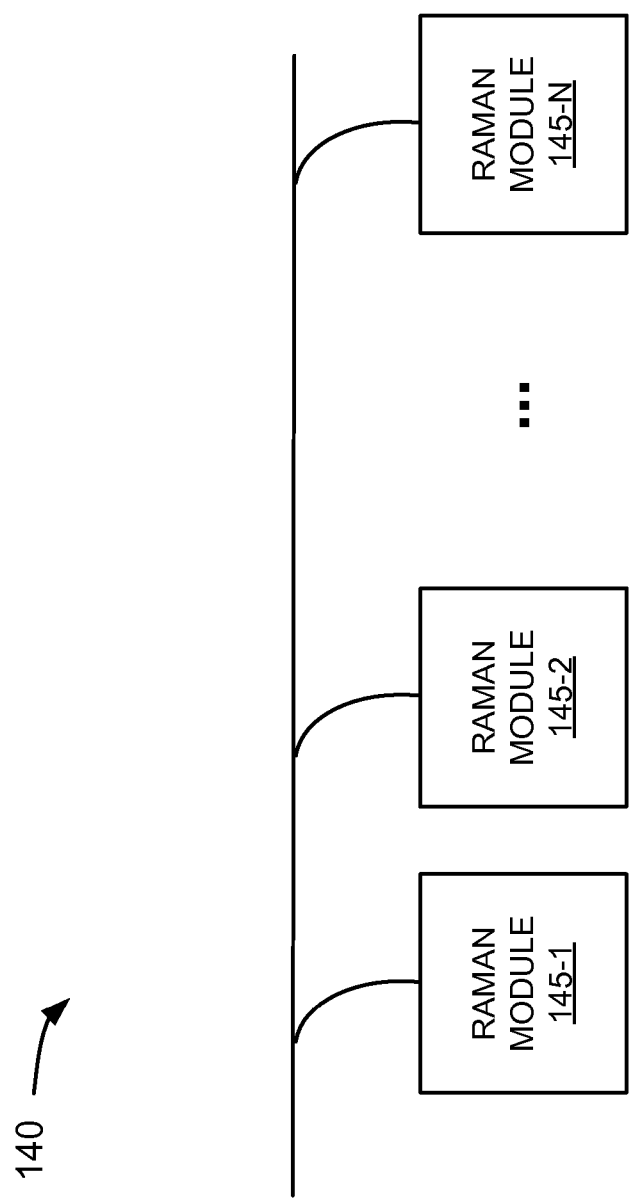

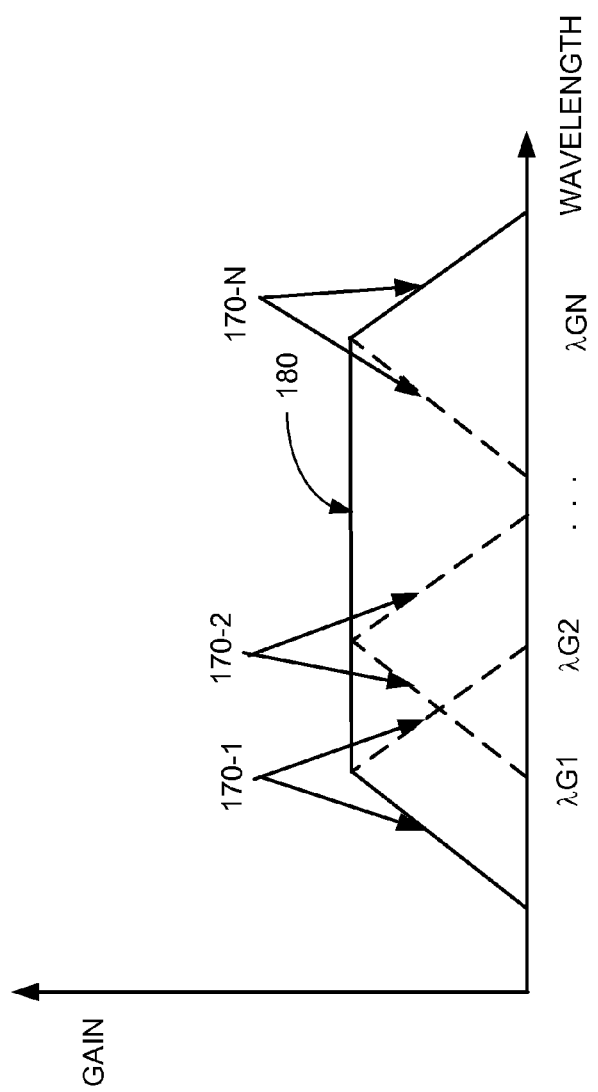

RAMAN PUMP CIRCUIT

BACKGROUND

Wavelength-Division Multiplexing (WDM) is a technique where optical signals, each modulated to carry a different information stream and each having a different wavelength are combined into a WDM signal and transmitted on an optical communication path including one or more segments of optical fiber, for example. Such WDM signals have greater capacity than systems in which a single modulated optical signal having a single wavelength is transmitted. Further information carrying capacity can be achieved by transmitting different polarization components of each signal that are modulated independently of each to carry separate data streams. For example, one component of the optical signal may have transverse electric (TE) polarization and another component of the optical signal may have a transverse magnetic (TM) polarization that is oriented orthogonal to the TE polarization. By separately modulating and combining (or multiplexing) TE and TM polarized optical signals at each wavelength, the information carrying capacity can be doubled compared to a WDM system that transmits optical signals having a single polarization at each wavelength. WDM systems in which TE and TM optical signals are combined are often referred to as Polarization Multiplexed (PM) WDM systems.

Typically, optical signals transmitted in a PM WDM system are attenuated as the optical signals propagate along the optical fiber. In order to compensate or offset such attenuation, the power level of the optical signals may be boosted or increased by optical amplifiers provided at periodic locations along the optical communication path. That is, the optical amplifiers may impart a gain to the optical signals. Erbium doped fiber amplifiers (EDFAs) that provide a "lumped" gain whereby the gain is imparted to the optical signals over relatively short lengths of erbium doped fiber. Other amplifiers, however, such as Raman amplifiers, may provide a gain that is distributed over relatively long lengths of optical fiber.

Raman amplifiers may include a laser or pump laser that supplies light (or pump light) at a particular wavelength to the optical communication path. If the wavelength of the wavelength of the pump light is properly selected, optical signals having wavelengths within a narrow range will be amplified through a known acoustic interaction in the optical fiber. Since PM WDM systems can include relatively large numbers of optical signals over a wide range of wavelengths, multiple pump lasers may be provided that supply pump light at a variety of wavelengths, each providing gain over a different wavelength ranges. Collectively, these wavelength ranges can encompass the wavelengths of each of the transmitted optical signals so that each optical signal can experience gain.

In order to Raman pump TE polarized light, TE polarized pump light may be required. Likewise, in order to pump TM polarized light, TM polarized pump light may also be required. Accordingly, Raman pump light is often supplied that has both TE and TM polarizations, thereby rendering construction of the Raman amplifier complicated. Moreover, additional components may be required to construct a Raman amplifier for use in a PM WDM system, thereby increasing the size and cost of the Raman amplifier.

SUMMARY

According to one or more possible implementations, a Raman pump may include a dual output laser configured to output two optical signals. The Raman pump may also include a delay interferometer configured to delay a first of the two optical signals to decorrelate the two optical signals from each other. The Raman pump may also include a combiner configured to combine the delayed first of the two optical signals and a second of two optical signals to provide a Raman amplification signal.

According to one or more possible implementations, an integrated circuit may include a Raman pump located on the integrated circuit. The Raman pump may provide a Raman amplification signal. The Raman pump may include a substrate and a multi-output laser, on the substrate, to output a group of optical signals. The Raman pump may also include a delay interferometer, on the substrate, to delay a first optical signal of the group of optical signals to decorrelate the group of optical signals from each other. The Raman pump may also include a polarization rotator, on the substrate, to rotate a second optical signal of the group of optical signals to form a rotated second optical signal. The rotated second optical signal may have an orthogonal polarization with respect to the first optical signal. The Raman pump may also include a combiner, on the substrate, to combine the first optical signal from the delay interferometer and the rotated second optical signal from the polarization rotator to provide the Raman amplification signal.

According to one or more possible implementations, a system may include a group of transmitters configured to provide transmitted signals. The system may also include a multiplexer configured to combine the transmitted signals from the transmitters into a combined signal for transmission on an optical transmission path that transmits the combined signal from the multiplexer. The system may also include a Raman amplifier that amplifies the combined signal from the optical transmission path. The Raman amplifier may include a multi-output laser to output a group of optical signals. The Raman amplifier may also include a delay interferometer to delay a first optical signal of the group of optical signals to decorrelate the group of optical signals from each other. The Raman amplifier may also include a polarization rotator to rotate a second optical signal of the group of optical signals to form a rotated second optical signal. The rotated second optical signal may have an orthogonal polarization with respect to the first optical signal. The Raman amplifier may also include a combiner to combine the first optical signal from the delay interferometer and the rotated second optical signal from the polarization rotator to provide a Raman amplification signal to the optical transmission path to amplify the combined signal from the optical transmission path. The system may also include a demultiplexer to decombine the amplified combined signal to provide the transmitted signals. The system may also include a group of receivers to receive the transmitted signals.

According to yet another aspect, a system may include a group of Raman amplifier modules to provide amplification signals for a group of wavelengths of light, each of the group of Raman amplifier modules to provide an amplification signal for a single wavelength of light. Each Raman amplifier of the group of modules may include an integrated Raman pump that includes a substrate; a dual output laser on the substrate to output a group of optical signals. The integrated Raman pump may also include a delay interferometer on the substrate to delay a first optical signal of the group of optical signals to decorrelate the group of optical signals from each other. The integrated Raman pump may also include a polarization rotator on the substrate to rotate a second optical signal of the group of optical signals to form a rotated second optical signal, the rotated second optical signal having an orthogonal polarization with respect to the first optical signal. The integrated Raman pump may also include a combiner on the substrate to combine the first optical signal from the delay interferometer and the rotated second optical signal from the polarization rotator to provide a Raman amplification signal to the optical transmission path to amplify the combined signal from the optical transmission path. The system may also include a Raman amplification medium configured to receive the Raman amplification signals from the group of integrated Raman pumps of the group of Raman amplifier modules and interact with the Raman amplification signals to provide the amplification signals for the group of wavelengths of light.

BRIEF DESCRIPTION OF THE DRAWINGS

The accompanying drawings, which are incorporated in and constitute a part of this specification, illustrate one or more implementations described herein and, together with the description, explain these implementations. In the drawings:

FIG. 1B is a diagram of an example Raman amplifier with multiple Raman modules;

FIG. 1C is a diagram of an example net Raman gain profile of multiple Raman gain profiles for multiple Raman modules;

DETAILED DESCRIPTION

The following detailed description refers to the accompanying drawings. The same reference numbers in different drawings may identify the same or similar elements.

A system and/or method, described herein, may incorporate counter-propagating Raman amplifier pumps (herein referred to generally as Raman pumps) in an integrated circuit to perform distributed Raman amplification (using a connected optical fiber as an amplifier medium). In one implementation, Raman pumps may be integrated on a common substrate rather than as discrete laser components. In one example, a Raman pump, as provided herein, includes an integrated circuit with a distributed feedback (DFB) laser, a polarization rotator (herein referred to as a rotator), and a polarization beam combiner (PBC). In another example, Raman amplifiers may be provided with other amplifiers, such as EDFAs to provide further gain.

Additionally, or alternatively, Raman pumps can also include a de-correlation component (e.g., a delay interferometer) to reduce correlation between pump light having TE and TM polarizations, for example, such that the output power of the combined TE and TM pump light is substantially uniform. The de-correlation component can include a delay line interferometer or a Lyot filter, for example. Additionally, or alternatively, Raman pumps can also include a laser other than a DFB laser, such as a distributed Bragg reflector (DBR) laser with a grating or filter. The grating or filter can stabilize the wavelength of the pump light output from the DBR laser.

Additionally, or alternatively, multiple Raman amplifiers can be provided to provide gain over a wide wavelength range and also to smooth out amplification peaks at particular wavelengths that may occur in the gain spectra of the Raman amplifiers.

Additionally, or alternatively, an example system can transmit optical signals, such as data carrying signals, in two bands and use a third band for Raman amplification. For example, the S-band (e.g., wavelength range of 1460-1530 nm) can be used a Raman pump for optical signals having wavelengths in the C-band (e.g., wavelength range of 1530-1565 nm) and/or the L-band (e.g., wavelength range of 1565-1625 nm).

Figure 1A:
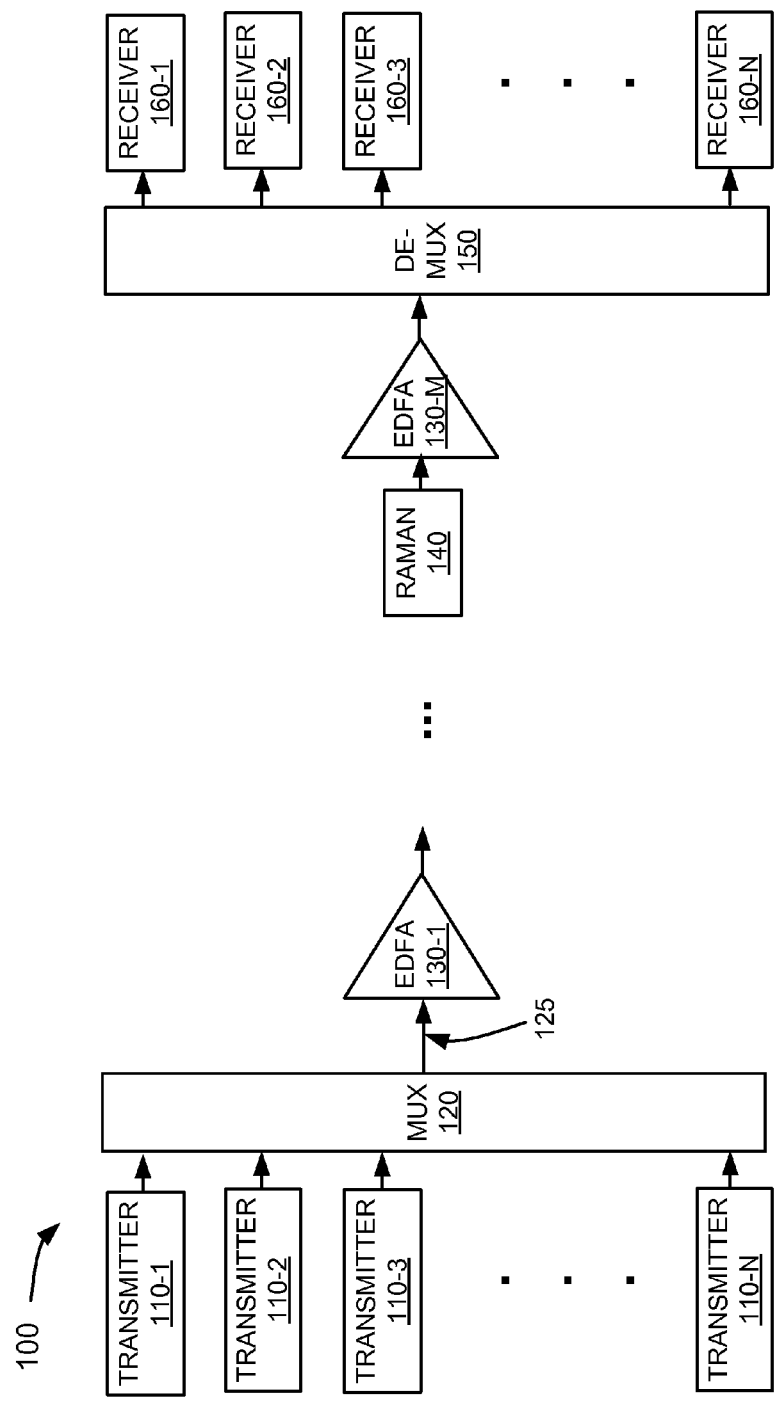
FIG. 1A is a diagram of an example system in which systems and/or methods described herein may be implemented.

FIG. 1A is a diagram of an example optical system 100 in which systems and/or methods described herein may be implemented. While FIG. 1A shows a particular number and arrangement of components, optical system 100 may include additional, fewer, different, or differently arranged components than those illustrated in FIG. 1A.

As shown in FIG. 1A, optical system 100 may include multiple transmitters 110, multiplexer 120, optical communication path 125, multiple EDFAs 130, Raman amplifier 140, demultiplexer 150, and multiple receivers 160.

Transmitters may include optical sources, such as lasers. Transmitters 110 can include multiple transmitters 110-1 through 110-N (N>1). Each of transmitters 110-1 through 110-N can receive a corresponding one of multiple data or information streams, and transmitters 110-1 to 110-N may output optical signals or channels to multiplexer 120. Typically, each transmitter 110-1 to 110-N outputs a modulated optical signal having a corresponding one of a plurality of wavelengths. In addition, each optical signal is polarization multiplexed to have both TE and TM components, as discussed above.

Multiplexer 120 (e.g., MUX) may include an optical combiner or an Arrayed Waveguide Grating (AWG). Multiplexer 120 may combine optical signals from transmitters 110 into a WDM signal that is output to optical communication path 125. Multiplexer 120 may be a combiner or an Arrayed Waveguide Grating (AWG), for example. Multiplexer 120 may also include one or more optical filters. Exemplary transmitters are described in U.S. patent application Ser. No. 12/981,835, filed Dec. 30, 2010, the entire contents of which are incorporated herein by reference.

Optical communication path 125 may include an optical transmission fiber or group of fibers. The optical transmission fiber or group of fibers may include silica fibers or any other optical fiber, such as a multiple core fiber. Optical communication path 125 may include an optical signal transmission line that connects multiplexer 120 to demultiplexer 150.

Optical communication path 125 may traverse a relatively long distance, such as hundreds or thousands of kilometers, over which optical signals may be attenuated in optical communication path 125, as discussed above. Accordingly, optical communication path 125 may include one or more EDFAs 130 and/or one or more Raman amplifiers 140 in order to amplify the optical signals traveling on the optical signal transmission line to compensate for signal loss. Additionally, one or more EDFAs 130 and/or one or more Raman amplifiers 140 may be located anywhere along optical communication path 125 and in any order. For example, Raman amplifier 140 may be located closer to multiplexer 120 than EDFA 130-1, multiple EDFAs 130 may be provided successively on optical communication path 125 with one Raman amplifier 140 located closer to the demultiplexer 150 on optical communication path 125, etc.

EDFAs may include silica fiber doped with erbium that can be pumped with a laser to exhibit amplification gains in an amplification window. EDFAs 130 may include multiple EDFAs 130-1 through 130-M (M>1) with one or more EDFAs 130 provided along optical communication path 125. EDFAs 130 may provide amplification of signal power from transmitters 110 to receivers 160 along optical communication path 125. For example, EDFAs can exhibit amplification gains in amplification windows that coincide with the C-band (e.g., wavelength range of 1530-1565 nm) and/or the L-band (e.g., wavelength range of 1565-1625 nm).

Raman amplifier 140 can include Raman pumps and may be provided along optical communication path 125. Raman amplifier 140 may provide amplification of signal power from transmitters 110 to receivers 160 along optical communication path 125.

A Raman pump may generally be referred to as an optical source that provides distributed Raman amplification. In one implementation, a Raman pump may include one or more pump lasers that produce pump power (also called pump light) (e.g., optical signals within the range of approximately 1420-1460 nm) that may be transmitted on the S-band. In one implementation, Raman pumps may be provided that provide pump light in the S-band to thereby supply gain to modulated optical signals output from transmitters 110-1 to 110-N in the C- and/or the L-bands. Raman pumps are further described below with reference to FIGS. 2-4.

Raman amplification mediums can include silica-based optical fiber segments included in optical communication path 125. In one example, the Raman pump light may be supplied to optical communication path so that the pump light propagates in the same direction as the modulated optical signals carrying data. In that case, the Raman pumps are provided in a co-propagating configuration. On the other hand, if the pump light travels in a direction opposite that of the modulated optical signals, the Raman pumps are in a counter-propagating configuration. In this example, Raman amplifier 140 can provide a peak gain at a particular wavelength of light (e.g., 1550 nm) and further impart gain to adjacent wavelengths of light (e.g., 1549 nm and 1551 nm), but to a lesser extent. Multiple Raman modules, which can include Raman pumps, may be provided in Raman amplifier 140 to provide gain over a relatively wide range of wavelengths.

Demultiplexer 150 may include a decombiner or an AWG. Demultiplexer 150 (e.g., DE-MUX) may decombine or demultiplex a group of optical signals from optical communication path 125 to receivers 160. Demultiplexer 150 may also include one or more optical filters.

Receivers 160 may include optical receivers, such as photodiodes. Receivers 160 can include multiple receivers 160-1 through 160-N. Each of receivers 160-1 through 160-N can receive a corresponding one of multiple data or information streams, and each receiver 160-1 to 160-N may receive one or more optical signals or channels from demultiplexer 150. Preferably, polarization demultiplexing circuitry is provided in demultiplexer 150 and/or receivers 160 to separate the TE and TM polarizations included in each optical signals. Once separated, the data carried by each polarization component of each optical signal can be demodulated and processed further.

FIG. 1B shows example Raman amplifier 140 having multiple Raman modules 145 (145-1 to 145-N). In one implementation, each of the multiple Raman modules 145 can be provided in Raman amplifier 140 to provide gain over a corresponding range of wavelengths. FIG. 1C illustrates net Raman gain profile 180, which is a sum of individual gain profiles (170-1 to 170-N) associated with Raman modules 145. The gain profiles are idealized in FIG. 1c for illustrative purposes herein. Generally, each individual gain profile 170-1 to 170-N has a corresponding one of peak gain wavelengths $\lambda G1$ to $\lambda GN$, and the Raman pump wavelength associated with each Raman module 145 is a Stoke's shift away from each peak gain wavelength. As further shown in FIG. 1C, the Raman gain for wavelengths spectrally adjacent each peak gain wavelength may be less than the peak gain. However, each gain profile 170-1 to 170-N may overlap one another, as shown in FIG. 1C, such that the net Raman gain profile 180 is substantially uniform over a relatively wide range of wavelengths, which can include the wavelengths of optical signals output from transmitters 110-1 to 110-N.

In one implementation, a Stokes shift or difference between the peak gain wavelength and the Raman pump wavelength may be 100 nm. For example, assuming optical communication path 125 includes segments of silica based optical fiber, Raman pump wavelengths in the S-band (e.g., wavelength range of 1460-1530 nm) can provide peak Raman gain in a range of, approximately 1560-1630 nm, which overlaps with the C-band (e.g., 1530-1565 nm) and the L-band (e.g., 1565-1625 nm). Other Raman pump wavelengths and corresponding peak gain wavelengths are contemplated herein.

Figure 2:
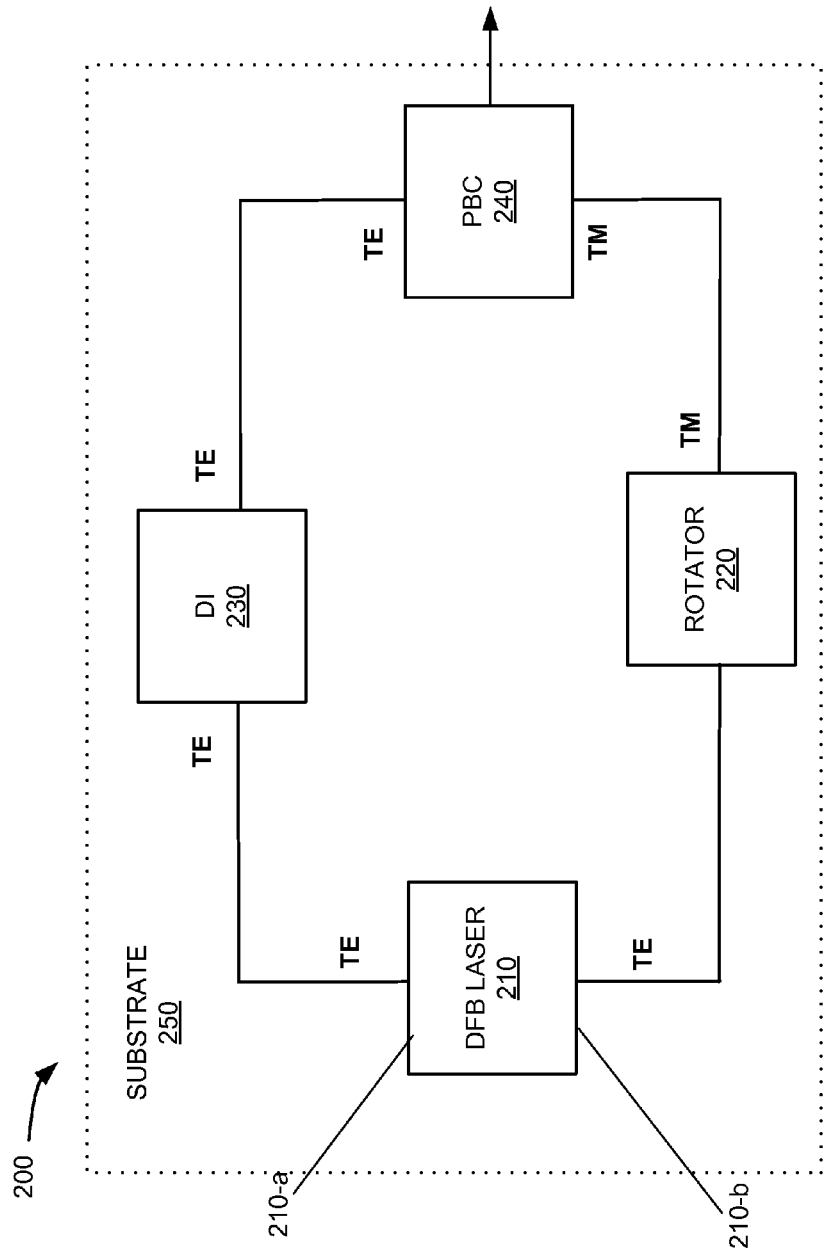
FIGS. 2, 3, and 4 are diagrams of example components of a Raman pump that may be used in a Raman amplifier shown in FIG. 1A.

FIG. 2 illustrates an example Raman pump 200 that can be provided in Raman amplifier 140. As illustrated in FIG. 2, Raman pump 200 can be integrated on common substrate 250 with DFB laser 210, rotator 220, delay interferometer (DI) 230, and polarization beam combiner 240.

DFB laser 210 has first and second facets (210-a and 210-b) through which first and second pump light is output, respectively. Such light has a TE polarization. In order to Raman amplify both the TE and TM polarization components of the optical signals transmitted on optical communication path 125, the TE polarization of the second pump light output from facet 210-b is rotated to be TM by rotator 220 (which may include an asymmetric waveguide or photonic bandgap structure). First pump light output from facet 210-1 maintains its TE polarization and is supplied to a delay interferometer (DI) 230, which is discussed in further detail below. The first pump light is then combined with the polarization rotated second pump light in polarization beam combiner (PBC) 240 and then supplied to optical communication path 125. In one example, the wavelength of the pump light is in the S-band.

Since the output of PBC 240 includes both TE and TM polarization components, corresponding components in the optical signals propagating in optical communication path 125 may experience Raman gain that may be uniform or substantially the same for both polarizations.

Further, with respect to FIG. 2, DI 230 may include a decorrelating device, such as a delay line interferometer or an optical filter. An example delay line interferometer can include a delay loop (which will be discussed below with respect to FIG. 3). An example optical filter can include a Lyot filter (e.g., an optical filter that may include birefringent crystalline plates and polarizers to delay optical signals).

Although rotator 220 may rotate a substantial portion of the input TE light, a residual TE component of such light may still be output from the rotator. Such residual TE light may interfere constructively or destructively with TE light output from facet 210-a to cause power fluctuations in the output of PBC 240. Accordingly, DI 230 may be provided to introduce a delay that allows the first pump light output from facet 210-a having a TE polarization and the rotated second pump supplied from facet 210-b having a TM polarization to be de-correlated. As a result, the first and second pump lights are rendered out of phase with respect to one another and the above-noted constructive or destructive interference between the two is reduced. PBC 240 may include a wave polarization splitter or a directional coupler.

Substrate 250 may include semiconductor or compound semiconductor substrates. In one implementation, substrate 250 can include indium phosphide (InP) or other suitable semiconductor materials.

Figure 3:
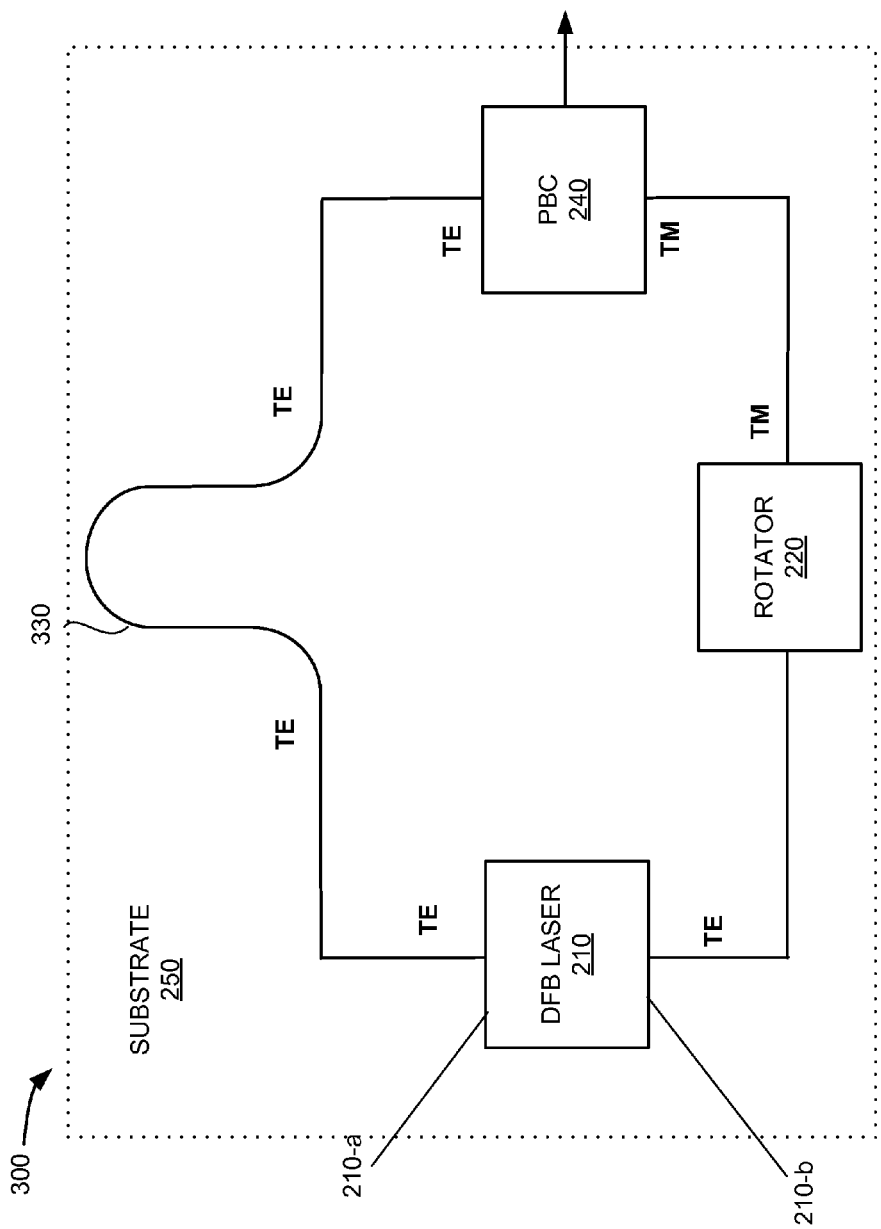

FIG. 3 illustrates an example Raman pump 300 that can be provided in Raman amplifier 140. As illustrated in FIG. 3, Raman pump 300 can be provided as an integrated circuit with DFB laser 210, rotator 220, polarizing beam combiner 240, and delay interferometer (DI) 330 on substrate 250. DFB laser 210, rotator 220, polarizing beam combiner 240, and DI 330 on substrate 250 may be similar to like components described with respect to FIG. 2.

FIG. 3 illustrates a DI 230 that may include a delay loop 330. Delay loop 330 may include a loop in an optical waveguide formed in substrate 250, such as a loop multiple spirals, curves, or the like. In one implementation, delay loop 330 can be a racetrack shaped loop or trombone shaped loop, such that several loops are provided in a minimal amount of area. An example of a racetrack configuration is described in U.S. Pat. No. 5,701,372, the contents of which are incorporated herein by reference.

Delay loop 330 may include a loop in a waveguide that delays a signal passing through the waveguide because the propagation distance there through is longer. Delay loop 330 can delay the first pump light (output from facet 210-*a*) and thus reduce the coherence between it and the rotated second pump light supplied from facet 210-*b*, as noted above.

Figure 4:
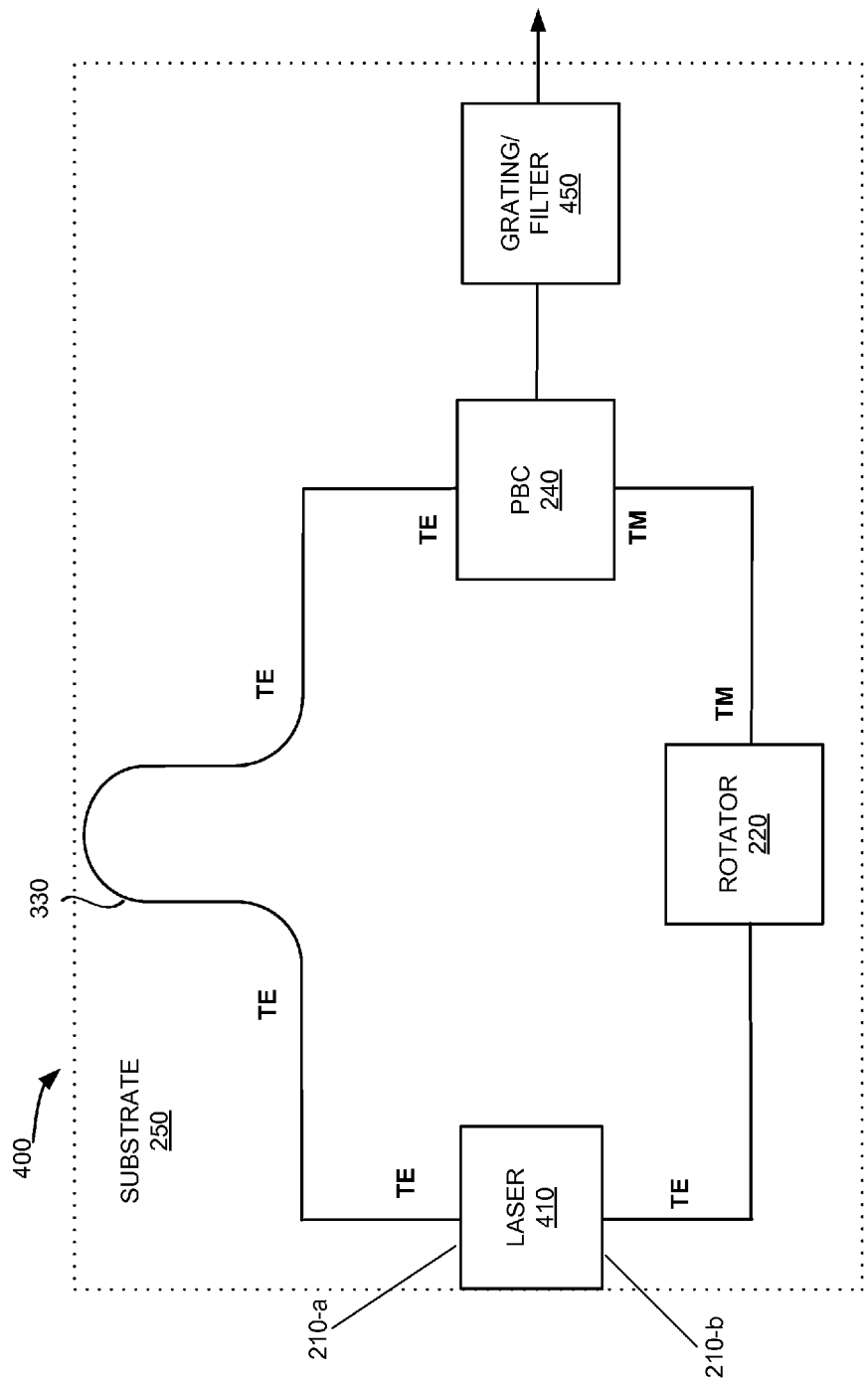

FIG. 4 illustrates an example Raman pump 400 consistent with a further aspect of the present disclosure. Raman pump 400 is similar to Raman pump 300, but includes grating/filter 450 (and laser 410) instead of DFB laser 210.

Laser 410 may include a DBR laser, which when used with a grating or filter, such as grating/filter 450, can output pump light having a wavelength that is substantially stable or unchanging over time.

Grating/filter 450 may be any appropriate grating or filter, and may be provided on another substrate separate from substrate 250 as part of a planar light wave circuit (PLC), including, for example, a Mach-Zehnder (MZ) interferometer, etc. Grating/filter 450 can be a silicon-based PLC and can be provided in a different package from the other components of Raman pump 400. Alternatively, grating/filter 450 may be integrated in the same package on substrate 250 with the other components of Raman pump 400, as illustrated in FIG. 4.

A system has been described herein which includes an integrated circuit counter-propagating Raman amplifier pumps to perform distributed Raman amplification. As provided herein, Raman pumps in integrated circuits can provide a monolithic pump that utilizes the Raman effect to amplify signals using a DFB laser, a polarization rotator, a PBC, and/or a delay interferometer. In an alternative embodiment, the pumps may be co-propagating.

Additionally, multiple Raman amplifiers can provide gain over a wavelength range and also smooth out amplification spikes that may occur in Raman amplifiers. Further, an example system is provided that can transmit data in two bands (e.g., the C-band and/or the L-band) and use a third band (e.g., the S-band) for Raman amplification.

The foregoing description provides illustration and description, but is not intended to be exhaustive or to limit the implementations to the precise form disclosed. Modifications and variations are possible in light of the above disclosure or may be acquired from practice of the implementations.

Further, the term "approximately" or "substantially" has been used throughout the description and is intended to mean the exact number or range that follows the term or a number within a particular threshold of the number or range that follows the term.

Also, while signals of particular example wavelengths have been described, one or more of these signals may have a different wavelength, or operate within a different range of wavelengths, in other implementations.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A Raman pump, comprising:
a laser that has first and second facets, the laser supplying a first optical signal from the first facet and a second optical signal from the second facet;
a delay interferometer that receives the first optical signal, such that the first optical signal is decorrleated relative to the second optical signal;
a combiner configured to combine the delayed first signal and the second optical signal to provide a Raman pump signal; and
a polarization rotator that receives the second optical signal and provides a rotated second optical signal, the rotated second optical signal having a polarization that is orthogonal with respect to a polarization of the first optical signal.

2. The Raman pump of claim 1, where the laser comprises a Distributed Feedback (DFB) laser.

3. The Raman pump of claim 1, further comprising a grating or filter to interact with the first and second optical signals, where the laser comprises a Distributed Bragg Reflector (DBR) laser.

4. The Raman pump of claim 1, where the delay interferometer comprises a delay line interferometer or a Lyot filter.

5. The Raman pump of claim 1, where the combiner comprises a Polarization Beam Combiner, a wave polarization splitter, or a directional coupler.

6. An integrated circuit comprising:
a Raman pump on the integrated circuit, the Raman pump to provide a Raman amplification signal, the Raman pump comprising:
a substrate;
a laser, on the substrate, including first and second facets that supply a plurality of optical signals;
a delay interferometer, on the substrate, to delay a first optical signal of the plurality of optical signals to decorrelate the plurality of optical signals from each other, the first optical signal being output from the first facet, the second facet outputting a second optical signal of the plurality of optical signals;
a polarization rotator, on the substrate, that receives the second optical signal of the plurality of optical signals and provides a rotated second optical signal, the rotated second optical signal having a polarization that is orthogonal with respect to a polarization of the first optical signal; and a combiner, on the substrate, to combine the first optical signal from the delay interferometer and the rotated second optical signal from the polarization rotator to provide the Raman amplification signal.

7. The integrated circuit of claim 6, where the laser comprises a Distributed Feedback (DFB) laser.

8. The integrated circuit of claim 6, further comprising a grating or filter on the substrate, the grating or filter to interact with the first and second optical signals, where the laser comprises a Distributed Bragg Reflector (DBR) laser.

9. The integrated circuit of claim 6, further comprising a grating or filter on a separate package from the substrate, the grating or filter to interact with the plurality of optical signals, where the laser comprises a Distributed Bragg Reflector (DBR) laser.

10. The integrated circuit of claim 6, where the delay interferometer comprises a delay line interferometer or a Lyot filter.

11. A system comprising:
a plurality of transmitters configured to provide transmitted signals;
a multiplexer configured to combine the transmitted signals from the transmitters into a combined signal for transmission on an optical transmission path to transmits the combined signal from the multiplexer;
a Raman amplifier to amplify the combined signal from the optical transmission path, the Raman amplifier comprising:
a laser to output a plurality of optical signals, a first optical signal of the plurality of optical signals being output from a first facet of the laser, and a second optical signal of the plurality of optical signals being output from a second facet of the laser;
a delay interferometer to delay the first optical signal of the plurality of optical signals to decorrelate the plurality of optical signals from each other;
a polarization rotator that receives the second optical signal of the plurality of optical signals and provides a rotated second optical signal, the rotated second optical signal having a polarization that is orthogonal with respect to a polarization of the first optical signal, the polarization of the first optical signal being a transverse electric (TE) polarization and the polarization of the rotated second optical being a transverse magnetic (TM) polarization; and
a combiner to combine the first optical signal from the delay interferometer and the rotated second optical signal from the polarization rotator to provide a Raman amplification signal to the optical transmission path to amplify the combined signal from the optical transmission path;
a demultiplexer to decombine the amplified combined signal to provide the transmitted signals; and
a plurality of receivers to receive the transmitted signals.

12. The system of claim 11, where the Raman amplifier further comprises a substrate, and where the laser, the delay interferometer, the polarization rotator, and the combiner of the Raman amplifier are provided on the substrate.

13. The system of claim 12, where the laser comprises a Distributed Feedback (DFB) laser; or
where the laser comprises a Distributed Bragg Reflector (DBR) laser, the Raman amplifier further comprises a grating or filter on the substrate, and where the grating or the filter is configured to interact with the plurality of optical signals.

14. The system of claim 12, where the Raman amplifier further comprises a grating or filter on a separate package from the substrate, where the grating or filter is configured to interact with the plurality of optical signals, where the laser comprises a Distributed Bragg Reflector (DBR) laser, and where the delay interferometer comprises a delay line interferometer or a Lyot filter.

15. The system of claim 12, further comprising a plurality of Erbium-Doped Fiber Amplifiers (EDFAs), where the Raman amplifier comprises a plurality of Raman amplifier modules, where the EDFAs and the Raman amplifier are configured to amplify the combined signal from the optical transmission path, and where the Raman amplifier and the EDFAs are in optical line amplifiers along the optical transmission path.

16. The system of claim 11, where the Raman amplifier is configured to provide an amplification signal in a first wavelength band, where data in the transmitted signals are in a second wavelength band and/or a third wavelength band, and where the second and the third wavelength bands include different wavelengths from the first wavelength band.

17. A system, comprising:
a plurality of Raman amplifier modules to provide amplification signals for a plurality of wavelengths of light, each of the plurality of Raman amplifier modules to provide an amplification signal for a single wavelength of light, and each Raman amplifier of the plurality of modules comprising:
an integrated Raman pump comprising:
a substrate;
a laser on the substrate to output a plurality of optical signals, a first optical signal of the plurality of optical signals being output from a first facet of the laser, and a second optical signal of the plurality of optical signals being output from a second facet of the laser;
a delay interferometer on the substrate to delay the first optical signal of the plurality of optical signals to decorrelate the plurality of optical signals from each other;
a polarization rotator on the substrate that receives the second optical signal of the plurality of optical signals and provides a rotated second optical signal, the rotated second optical signal having a polarization that is orthogonal with respect to a polarization of the first optical signal; and
a combiner on the substrate to combine the first optical signal from the delay interferometer and the rotated second optical signal from the polarization rotator to provide a Raman amplification signal to the optical transmission path to amplify the combined signal from the optical transmission path; and
a Raman amplification medium configured to receive the Raman amplification signals from the plurality of integrated Raman pumps of the plurality of Raman amplifier modules and interact with the Raman amplification signals to provide the amplification signals for the plurality of wavelengths of light.

18. The system of claim 17, where the plurality of Raman amplifier modules is configured to provide the amplification signals for the plurality of wavelengths of light as amplification signals in a first wavelength band, where data signals for amplification by the amplification signals of the plurality of Raman amplifier modules are in a second wavelength band and/or a third wavelength band, and where the second and the third wavelength bands include different wavelengths from the first wavelength band.

19. The system of claim 17, where each of the plurality of integrated Raman pumps further comprises a grating or filter configured to interact with the plurality of optical signals, where the laser comprises a Distributed Bragg Reflector (DBR) laser, and where the delay interferometer comprises a delay line interferometer or a Lyot filter.

* * * * *